United States Patent
Kato (10) Patent No.: US 12,100,885 B2
(45) Date of Patent: *Sep. 24, 2024

(54) MILLIMETER WAVE MODULE

(71) Applicant: Murata Manufacturing Co., Ltd., Kyoto (JP)

(72) Inventor: Takatoshi Kato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 992 days.

This patent is subject to a terminal disclaimer.

(21) Appl. No.: 16/998,335

(22) Filed: Aug. 20, 2020

(65) Prior Publication Data

US 2020/0381803 A1 Dec. 3, 2020

Related U.S. Application Data (63) Continuation of application No. PCT/JP2018/040309, filed on Oct. 30, 2018.

(30) Foreign Application Priority Data

Apr. 25, 2018 (JP) .................. 2018-083542

(51) Int. Cl.
*H01Q 1/22* (2006.01)
*H01L 23/66* (2006.01)
(Continued)

(52) U.S. Cl.
CPC ........... *H01Q 1/2283* (2013.01); *H01L 23/66* (2013.01); *H01P 5/028* (2013.01); *H01P 5/08* (2013.01)

(58) Field of Classification Search
CPC ............. H01L 23/66; H01L 2223/6616; H01L 2223/6627; H01L 2223/6633;
(Continued)

(56) References Cited

U.S. PATENT DOCUMENTS 11,557,821 B2 * 1/2023 Kato ...................... H01P 3/088
2002/0034839 A1 3/2002 Iwaki et al.
(Continued)

FOREIGN PATENT DOCUMENTS

JP S62-065825 U 4/1987
JP 2000-068713 A 3/2000
(Continued)

OTHER PUBLICATIONS

International Search Report issued in Application No. PCT/JP2018/040309, dated Jan. 22, 2019.
(Continued)

*Primary Examiner* — David A Zarneke
(74) *Attorney, Agent, or Firm* — Pearne & Gordon LLP (57) ABSTRACT

A millimeter wave module includes an insulating substrate, signal conductor patterns, ground conductor patterns, and a connection member. The connection member is disposed between the signal conductor patterns in the thickness direction and electrically connects the signal conductor patterns. The connection member includes a first conductive member, a second conductive member, and a dielectric block. The connection member has a structure in which the first conductive member and the second conductive member sandwich a dielectric block therebetween. The first conductive member is connected to the signal conductor patterns. The second conductive member is connected to the ground conductor pattern.

15 Claims, 9 Drawing Sheets (51) Int. Cl.
*H01P 5/02* (2006.01)
*H01P 5/08* (2006.01)

(58) Field of Classification Search
CPC ......... H01Q 1/2283; H01P 5/02; H01P 5/028; H01P 3/006; H01P 3/0282; H01P 3/088
See application file for complete search history.

(56) References Cited

U.S. PATENT DOCUMENTS

2004/0196122 A1* 10/2004 Fisher ................. H05K 1/0222
333/246
2006/0022774 A1* 2/2006 Greeley ............... H05K 3/4046
333/246

FOREIGN PATENT DOCUMENTS

| JP | 2000-100993 A | 4/2000 |
| JP | 2000-188478 A | 7/2000 |
| JP | 2004-304401 A | 10/2004 |

OTHER PUBLICATIONS

Written Opinion issued in Application No. PCT/JP2018/040309, dated Jan. 22, 2019.
Tsai et al., "Array Antenna Integrated Fan-out Wafer Level Packaging (InFO-WLP) for Millimeter Wave System Applications", IEEE, IEDM 13-605, 2013.
Chinese Office action for Application No. 201880092700.4 dated Apr. 30, 2021.

* cited by examiner

MILLIMETER WAVE MODULE

This is a continuation of International Application No. PCT/JP2018/040309 filed on Oct. 30, 2018, which claims priority from Japanese Patent Application No. 2018-083542 filed on Apr. 25, 2018. The contents of these applications are incorporated herein by reference in their entireties.

BACKGROUND

Technical Field

The present disclosure relates to a millimeter wave module that is an electronic component using a high frequency signal in a millimeter wave band.

To date, various millimeter wave modules have been proposed. For example, NPL 1 describes a millimeter wave module using a component-embedded substrate technology.

The millimeter wave module described in NPL 1 uses a fan out wafer level package (FOWLP) technology.

NPL 1: C-H Tsai et al., "Array Antenna Integrated Fan-out Wafer Level Packaging (InFO-WLP) for Millimeter Wave System Applications, IEDM 2013, p. IEDM 13-605 (2013)

BRIEF SUMMARY

In existing millimeter wave modules, when forming a transmission line, an antenna, or the like in a plurality of layers that differ in the thickness direction, it is sometimes necessary to connect conductor patterns, which have been formed on the plurality of layers, via a conductor pattern or the like extending in the thickness direction.

However, the conductor pattern extending in the thickness direction has an inductance. The inductance causes mismatching in a millimeter wave frequency band, and transmission loss occurs between the conductor patterns on the plurality of layers.

The present disclosure provides a millimeter wave module that suppresses transmission loss between the conductor patterns on the plurality of layers.

A millimeter wave module according to the present disclosure includes an insulating substrate, a first conductor pattern, a second conductor pattern, a ground conductor pattern, and a connection member. The insulating substrate has a first main surface and a second main surface that are disposed at different positions in a thickness direction and that are parallel to each other. The first conductor pattern is formed on the first main surface and transmits a millimeter wave signal. The second conductor pattern is formed on the second main surface and transmits the millimeter wave signal. The ground conductor pattern is formed on the first main surface or the second main surface. The connection member is disposed between the first conductor pattern and the second conductor pattern in the thickness direction and electrically connects the first conductor pattern to the second conductor pattern. The connection member includes a first conductive member, a second conductive member, and a dielectric block, and has a block shape in which the first conductive member and the second conductive member sandwich the dielectric block therebetween. The first conductive member is connected to the first conductor pattern and the second conductor pattern. The second conductive member is connected to the ground conductor pattern.

With this configuration, the connection member forms a capacitance between the conductor line, which connects the first conductor pattern to the second conductor pattern, and the ground. Thus, characteristic impedance matching of a portion that connects the first conductor pattern to the second conductor pattern can be set to a desirable value. Moreover, the structure that sets the characteristic impedance to a desirable value is realized simply and with high precision.

In the millimeter wave module according to the present disclosure, the first conductive member and the second conductive member may be conductor blocks.

With this configuration, the structure of the connection member is further simplified.

The millimeter wave module according to the present disclosure may have the following configuration. The first conductive member includes a rectangular-parallelepiped-shaped first base material portion that is rectangular and that has insulating ability; a first conductor film that is formed on a surface of the first base material portion, the surface facing the first conductor pattern; a second conductor film that is formed on a surface of the first base material portion, the surface facing the second conductor pattern; and a third conductor film for forming capacitance, the third conductor film being connected to the first conductor film and the second conductor film and being formed on a surface of the first base material portion, the surface being in contact with the dielectric block.

Also, with this configuration, the structure that sets the characteristic impedance to a desirable value is realized with high precision.

The millimeter wave module according to the present disclosure may have the following configuration. The first conductive member includes a fourth conductor film disposed at a position that is separated further than the third conductor film from the dielectric block, and a first auxiliary connection conductor that connects the third conductor film to the fourth conductor film. The third conductor film has a shape that does not reach a surface of the first conductive member on which the first conductor film is formed and a surface of the first conductive member on which the second conductor film is formed. The first conductor film and the second conductor film have shapes that do not reach a surface of the first conductive member on which the third conductor film is formed and are connected to the fourth conductor film.

Also, with this configuration, the structure that sets the characteristic impedance to a desirable value is realized with high precision. Moreover, unnecessary coupling and short-circuit between the first conductor film or the second conductor film and the second conductive member are suppressed.

The millimeter wave module according to the present disclosure may have the following configuration. The second conductive member includes a rectangular-parallelepiped-shaped second base material portion that is rectangular and that has insulating ability; a fifth conductor film that is formed on a surface of the second base material portion, the surface facing the ground conductor pattern; and a sixth conductor film for forming capacitance, the sixth conductor film being formed on a surface of the second base material portion, the surface being in contact with the dielectric block.

Also, with this configuration, the structure that sets the characteristic impedance to a desirable value is realized with high precision.

The millimeter wave module according to the present disclosure may have the following configuration. The second conductive member includes a seventh conductor film disposed at a position that is separated further than the sixth conductor film from the dielectric block, and a second auxiliary connection conductor that connects the sixth conductor film to the seventh conductor film. The sixth conductor film has a shape that does not reach a surface of the second conductive member on which the ground conductor pattern is formed. The ground conductor pattern has a shape that does not reach a surface of the second conductive member on which the sixth conductor film is formed and is connected to the seventh conductor film.

Also, with this configuration, the structure that sets the characteristic impedance to a desirable value is realized with high precision. Moreover, unnecessary coupling and short-circuit between the ground conductor pattern and the first conductive member are suppressed.

In the millimeter wave module according to the present disclosure, a dielectric constant of the dielectric block can differ from a dielectric constant of the insulating substrate.

With this configuration, a desirable characteristic impedance can be easily realized.

In the millimeter wave module according to the present disclosure, the dielectric constant of the dielectric block can be higher than the dielectric constant of the insulating substrate.

With this configuration, the size of the connection member can be reduced, and the size of the millimeter wave module can be reduced.

With the present disclosure, in a millimeter wave module, transmission loss between the conductor patterns on the plurality of layers can be suppressed.

BRIEF DESCRIPTION OF DRAWINGS

FIG. 11A is a perspective view, FIG. 11B is a plan view.

FIG. 12A is a perspective view, FIG. 12B is a plan view.

DESCRIPTION OF EMBODIMENTS

Figure 1A:
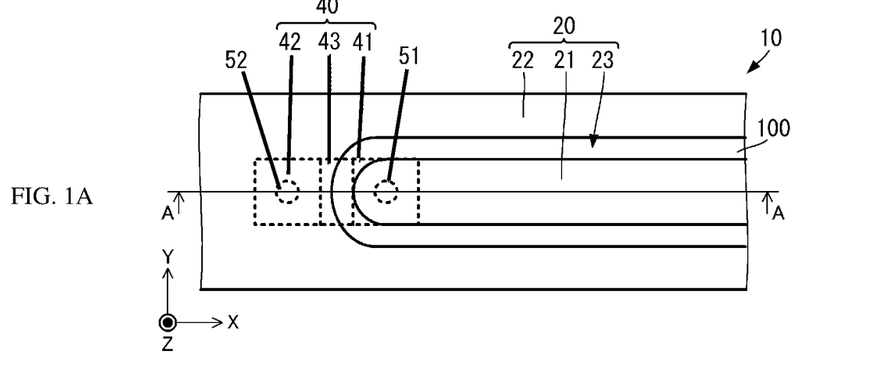
FIG. 1A illustrates a first main surface 101 of a millimeter wave module 10 according to a first embodiment.
Figure 1B:
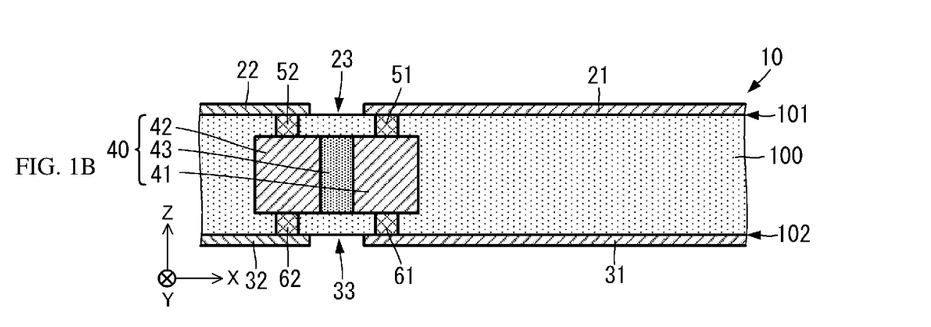
FIG. 1B is a sectional view, taken along line A-A, of the millimeter wave module 10 according to the first embodiment.
Figure 1C:
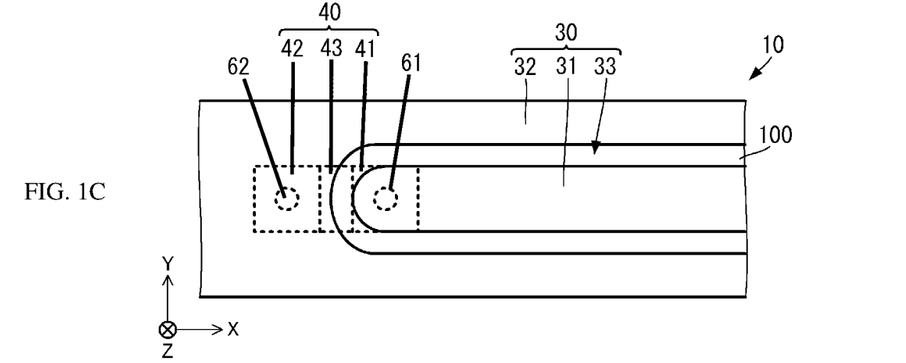
FIG. 1C illustrates a second main surface 102 of the millimeter wave module 10 according to the first embodiment.
Figure 2:
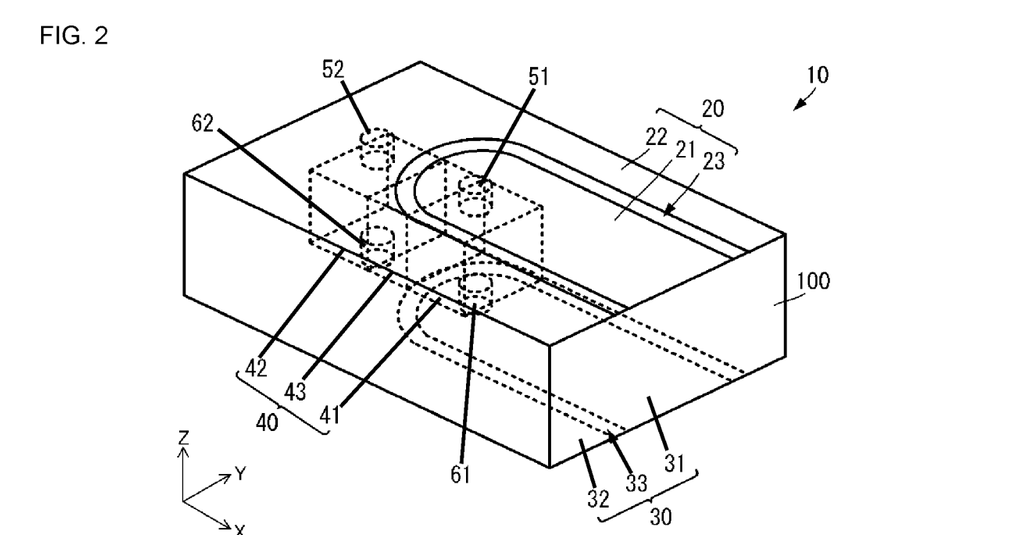
FIG. 2 is a perspective view of the millimeter wave module 10 according to the first embodiment.
Figure 3:
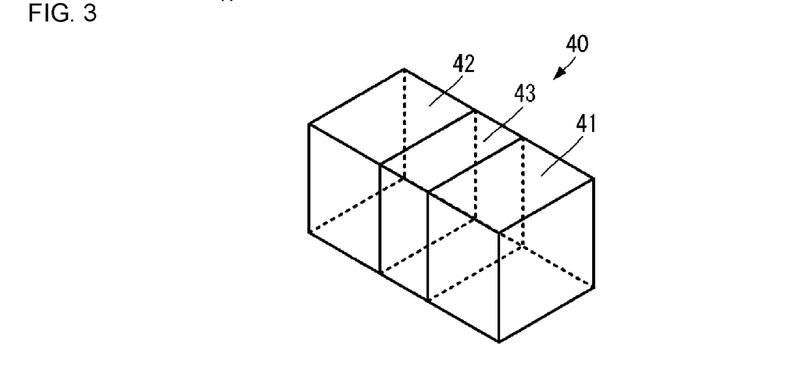
FIG. 3 is a perspective view of a connection member 40 of the millimeter wave module 10 according to the first embodiment.

A millimeter wave module according to a first embodiment of the present disclosure will be described with reference to the drawings. FIG. 1A illustrates a first main surface 101 of a millimeter wave module 10 according to the first embodiment, FIG. 1B is a sectional view, taken along line A-A, of the millimeter wave module 10 according to the first embodiment, and FIG. 1C illustrates a second main surface 102 of the millimeter wave module 10 according to the first embodiment. FIG. 2 is a perspective view of the millimeter wave module 10 according to the first embodiment. FIG. 3 is a perspective view of a connection member 40 of the millimeter wave module 10 according to the first embodiment. To facilitate understanding of configurations, the dimensions in the figures are exaggerated and differ from the actual dimensions.

As illustrated in FIGS. 1 and 2, the millimeter wave module 10 includes an insulating substrate 100, a first transmission line 20, a second transmission line 30, a connection member 40, a via conductor 51, a via conductor 52, a via conductor 61, and a via conductor 62.

The millimeter wave module 10 is realized by using, for example, a fan out wafer level package (FOWLP) technology.

The insulating substrate 100 has the first main surface 101 and the second main surface 102 that are parallel to each other. The first main surface 101 and the second main surface 102 extend in the X direction and the Y direction (direction perpendicular to the X direction). The first main surface 101 and the second main surface 102 are separated from each other in the Z direction (direction perpendicular to the X direction and the Y direction). The Z direction corresponds to the thickness direction of the insulating substrate 100.

The first transmission line 20 includes a signal conductor pattern 21, a ground conductor pattern 22, and a gap 23. The signal conductor pattern 21 corresponds to "first conductor pattern" in the present disclosure. The signal conductor pattern 21 and the ground conductor pattern 22 are formed on the first main surface 101.

The signal conductor pattern 21 has a predetermined width (length in the Y direction) and has a shape extending in the X direction. The ground conductor pattern 22 is formed on a region of the first main surface 101 excluding a region on which the signal conductor pattern 21 is formed, and has a shape in which the ground conductor pattern 22 is separated from the signal conductor pattern 21 by a predetermine distance. This separating part is the gap 23.

With this configuration, the first transmission line 20 realizes a first coplanar waveguide (CPW).

The second transmission line 30 includes a signal conductor pattern 31, a ground conductor pattern 32, and a gap 33. The signal conductor pattern 31 corresponds to "second conductor pattern" in the present disclosure. The signal conductor pattern 31 and the ground conductor pattern 32 are formed on the second main surface 102.

The signal conductor pattern 31 has a predetermined width (length in the Y direction) and has a shape extending in the X direction. The signal conductor pattern 31 overlaps the signal conductor pattern 21 in plan view of the millimeter wave module 10 and the insulating substrate 100. An end portion of the signal conductor pattern 31 in the direction in which the signal conductor pattern 31 extends overlaps, with a predetermined area, an end portion of the signal conductor pattern 21 in the direction in which the signal conductor pattern 21 extends.

The ground conductor pattern 32 is formed on a region of the second main surface 102 excluding a region on which the signal conductor pattern 31 is formed, and has a shape in which the ground conductor pattern 32 is separated from the signal conductor pattern 31 by a predetermined distance. This separating part is the gap 33. The ground conductor pattern 32 overlaps the ground conductor pattern 22 in plan view of the millimeter wave module 10 and the insulating substrate 100.

With this configuration, the second transmission line 30 realizes a second coplanar waveguide (CPW).

As illustrated in FIGS. 1A to 1C and FIGS. 2 and 3, the connection member 40 has a rectangular parallelepiped shape. The connection member 40 includes a first conductive member 41, a second conductive member 42, and a dielectric block 43. The first conductive member 41, the second conductive member 42, and the dielectric block 43, each has a rectangular parallelepiped shape.

The first conductive member 41 and the second conductive member 42 sandwich the dielectric block 43 therebetween. To be more specific, the first conductive member 41 is in contact with a surface of the dielectric block 43. The second conductive member 42 is in contact with a surface of the dielectric block 43 opposite to the surface that is in contact with the first conductive member 41. With this structure, the connection member 40 functions as a capacitor having the first conductive member 41 and the second conductive member 42 as counter electrodes. By appropriately setting the shapes of the first conductive member 41, the second conductive member 42, and the dielectric block 43, a predetermined capacitance can be realized for a millimeter wave band.

The connection member 40 is manufactured, for example, as follows. First, a base material is formed by stacking a conductor block, a dielectric block, and a conductor block in this order and by joining these blocks together. Alternatively, a conductor layer, a dielectric layer, and a conductor layer may be stacked in this order by using a semiconductor forming process or the like. Next, by cutting the base material into desirable dimensions and by performing polishing, the connection member 40, which has a rectangular parallelepiped shape, is formed so that the first conductive member 41 and the second conductive member 42 are sandwiched by the dielectric block 43. The connection member 40 need not have a completely rectangular parallelepiped shape, and may have a block shape as a unit.

The dimensions of the connection member 40 are, for example, as follows. The length of the connection member in a direction in which the first conductive member 41, the dielectric block 43, the second conductive member 42 are arranged in order is 400 μm. In this direction, the length of each of the first conductive member 41 and the second conductive member 42 is 150 μm, and the length of the dielectric block 43 is 100 μm. The lengths of the connection member 40 in other directions are each 200 μm.

The connection member 40 is disposed inside the insulating substrate 100. In other words, the connection member 40 is disposed between the first main surface 101 and the second main surface 102 and further between the first transmission line 20 and the second transmission line 30. In this case, the direction in which the first conductive member 41, the dielectric block 43, and the second conductive member 42 are arranged in order is parallel to the X direction.

To be more specific, the first conductive member 41 of the connection member 40 is disposed between the signal conductor pattern 21 and the signal conductor pattern 31, and the second conductive member 42 is disposed between the ground conductor pattern 22 and the ground conductor pattern 32.

The via conductor 51, the via conductor 52, the via conductor 61, and the via conductor 62 are formed inside the insulating substrate 100. The via conductor 51 connects one surface of the first conductive member 41 to the signal conductor pattern 21 with the shortest distance. The via conductor 61 connects the other surface of the first conductive member 41 (surface opposite to the one surface of the first conductive member 41) to the signal conductor pattern 31 with the shortest distance. The via conductor 52 connects one surface of the second conductive member 42 to the ground conductor pattern 22 with the shortest distance. The via conductor 62 connects the other surface of the second conductive member 42 to the ground conductor pattern 32 with the shortest distance.

With such a configuration, the millimeter wave module 10 realizes a structure in which the first transmission line 20 and the second transmission line 30, which are formed on different layers of the insulating substrate 100, are connected by the connection member 40.

Here, the signal conductor pattern 21 of the first transmission line 20 and the signal conductor pattern 31 of the second transmission line 30 are separated by a distance equal to the thickness of the insulating substrate 100. Accordingly, an inductance corresponding to this distance is generated in a connection line between the signal conductor pattern 21 and the signal conductor pattern 31.

However, due to the presence of the connection member 40, a capacitance is inserted between the connection line and the ground (grounded potential). Thus, the characteristic impedance of the connection line is adjusted, and matching with the characteristic impedance of the first transmission line 20 and the second transmission line 30 is realized. Thus, a millimeter wave signal can be transmitted with a small loss between the first transmission line 20 and the second transmission line 30.

Moreover, by using this configuration, a structure for adjusting the characteristic impedance of the connection line between the first transmission line 20 and the second transmission line 30 can be realized with a simple structure. Thus, the millimeter wave module 10 that can perform transmission with small loss can be realized with a simple configuration. Accordingly, the millimeter wave module 10 can be manufactured at low cost.

Furthermore, the positional relationship among the constituent elements of the millimeter wave module 10 can be realized easily and with high precision by using a method of forming a component-embedded substrate to which a FOWLP technology is applied. Accordingly, the millimeter wave module 10 can realize the characteristic impedance of a connection line with higher precision and can realize impedance matching with higher precision. Thus, the millimeter wave module 10 can realize, with higher precision, a structure for transmitting a millimeter wave signal with small loss.

Moreover, the connection member 40 is formed by using a dicing method, a semiconductor forming process, or the like, and thus can realize highly precise dimensions. Accordingly, capacitance can be realized with high precision, and impedance matching can be realized with higher precision. Thus, the millimeter wave module 10 can realize, with high precision, a structure for transmitting a millimeter wave signal with smaller loss.

The dielectric constant of the dielectric block 43 of the connection member 40 can differ from the dielectric constant of the insulating substrate 100. In this case, capacitance to be realized by the connection member 40 can be easily set to a desirable value. The dielectric constant of the dielectric block 43 of the connection member 40 can be higher than the dielectric constant of the insulating substrate 100. In this case, the shape of the connection member 40 for obtaining a desirable capacitance can be reduced in size. Accordingly, the size of the millimeter wave module 10 can be reduced.

By using the connection member 40, a configuration with smaller loss than a general chip capacitor having multilayered electrodes can be realized. With a general chip capacitor having multilayered electrodes, ESL and ESR tend to increase in a millimeter wave band due to an edge effect. However, when the connection member 40 is used, such increase of ESL and ESR does not occur. Accordingly, a configuration with small loss can be realized.

The via conductor 51, the via conductor 52, the via conductor 61, and the via conductor 62 can be as short as possible. That is, the dimension of the connection member 40 in the Z direction can be close to the dimension of the insulating substrate 100 in the Z direction. In this case, transmission loss due to the via conductor 51, the via conductor 52, the via conductor 61, and the via conductor 62 can be suppressed. Note that, even if the lengths of the via conductor 51, the via conductor 52, the via conductor 61, and the via conductor 62 are large, by adjusting the capacitance of the connection member 40, mismatch of characteristic impedance due to an inductance based on the lengths of the via conductors can be suppressed.

Figure 4A:
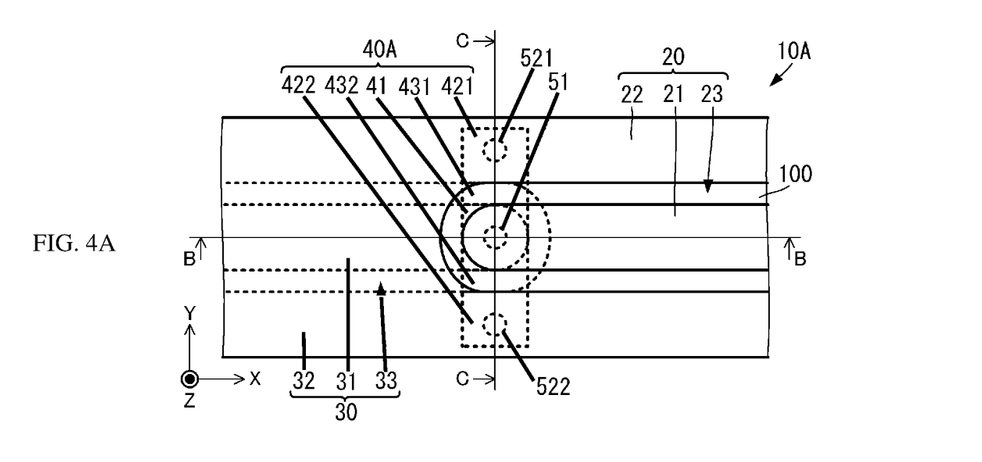
FIG. 4A illustrates a first main surface of a millimeter wave module 10A according to a second embodiment.
Figure 4B:
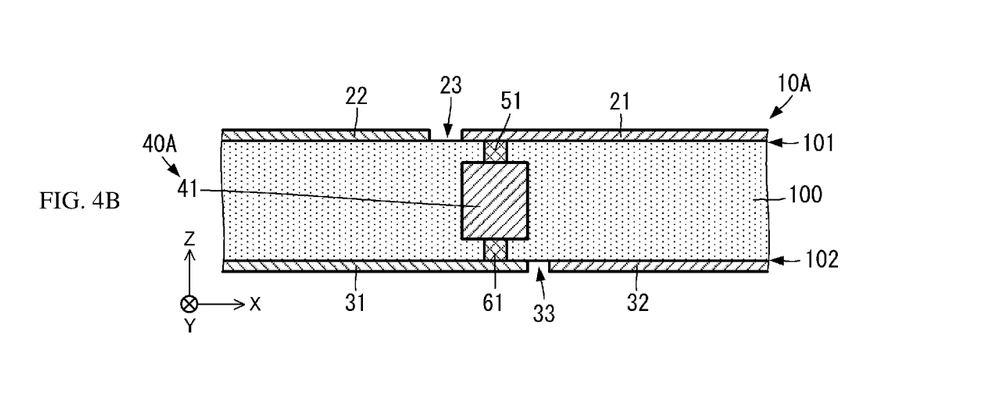
FIG. 4B is a sectional view, taken along line B-B, of the millimeter wave module 10A according to the second embodiment.
Figure 5A:
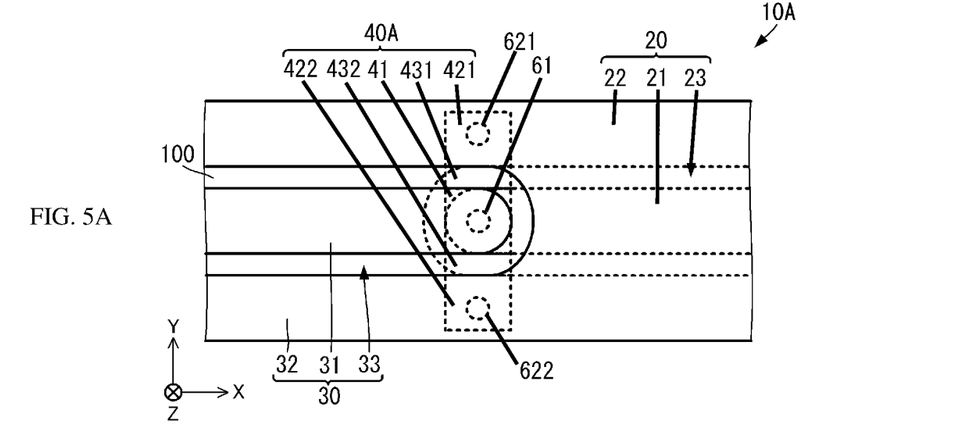
FIG. 5A illustrates a second main surface 102 of the millimeter wave module 10A according to the second embodiment.
Figure 5B:
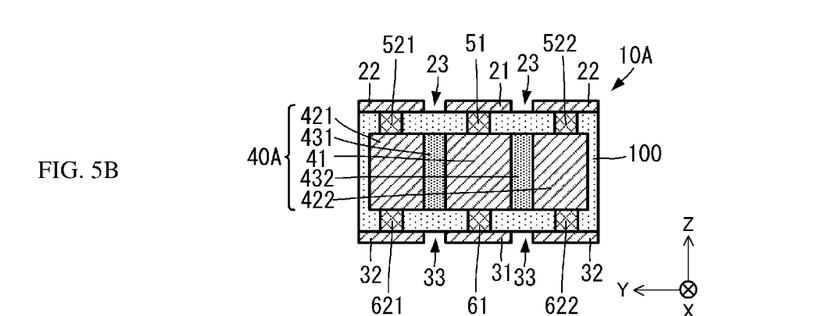
FIG. 5B is a sectional view, taken along line C-C, of the millimeter wave module 10A according to the second embodiment.
Figure 6:
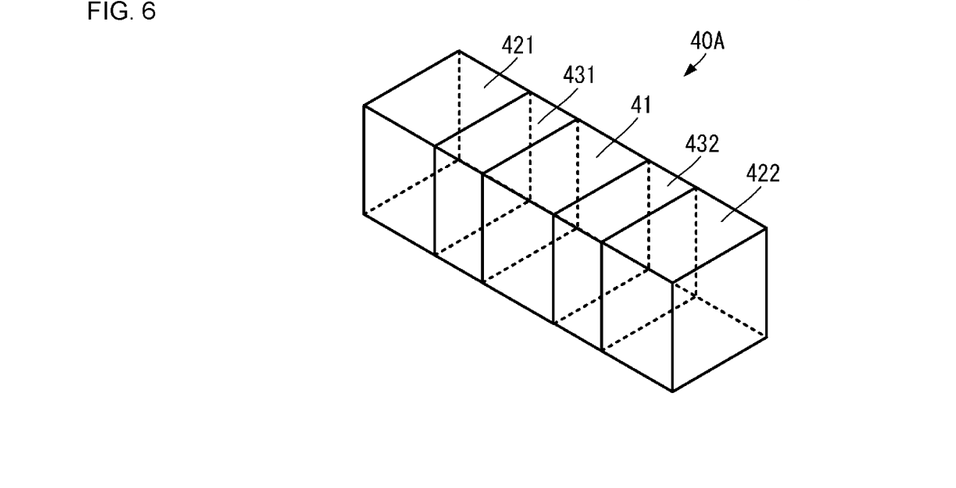
FIG. 6 is a perspective view of a connection member 40A of the millimeter wave module 10A according to the second embodiment.

Next, a millimeter wave module according to a second embodiment of the present disclosure will be described with reference to the drawings. FIG. 4A illustrates a first main surface 101 of a millimeter wave module 10A according to the second embodiment, and FIG. 4B is a sectional view, taken along line B-B, of the millimeter wave module 10A according to the second embodiment. FIG. 5A illustrates a second main surface 102 of the millimeter wave module 10A according to the second embodiment, and FIG. 5B is a sectional view, taken along line C-C, of the millimeter wave module 10A according to the second embodiment. FIG. 6 is a perspective view of a connection member 40A of the millimeter wave module 10A according to the second embodiment. To facilitate understanding of configurations, the dimensions in the figures are exaggerated and differ from the actual dimensions.

The millimeter wave module 10A according to the second embodiment differs from the millimeter wave module 10 according to the first embodiment in the positional relationship between the signal conductor pattern 21 and the signal conductor pattern 31 and the structure of the connection member 40A. In other respects, the millimeter wave module 10A is similar to the millimeter wave module 10, and description of similar parts will be omitted.

The signal conductor pattern 21 and the signal conductor pattern 31 are at the same position on the insulating substrate 100 in the Y direction but extend in opposite directions in the X direction. In other words, the direction in which the signal conductor pattern 21 extends from one end thereof is opposite to the direction in which the signal conductor pattern 31 extends from one end thereof.

The one end of the signal conductor pattern 21 and the one end of the signal conductor pattern 31 overlap with a predetermined area in plan view. The other part of the signal conductor pattern 21 overlaps the ground conductor pattern 32 in plan view. The other part of the signal conductor pattern 31 overlaps the ground conductor pattern 22 in plan view.

As illustrated in FIG. 6, the connection member 40A has a rectangular parallelepiped shape.

The connection member 40A includes a first conductive member 41, a second conductive member 421, a second conductive member 422, a dielectric block 431, and a dielectric block 432. The first conductive member 41, the second conductive member 421, the second conductive member 422, the dielectric block 431, and the dielectric block 432, each has a rectangular parallelepiped shape.

The first conductive member 41 and the second conductive member 421 sandwich the dielectric block 431 therebetween. To be more specific, the first conductive member 41 is in contact with a surface of the dielectric block 431. The second conductive member 421 is in contact with a surface of the dielectric block 431 opposite to the surface that is in contact with the first conductive member 41.

The first conductive member 41 and the second conductive member 422 sandwich the dielectric block 432 therebetween. To be more specific, the first conductive member 41 is in contact with a surface of the dielectric block 432. The second conductive member 422 is in contact with a surface of the dielectric block 432 opposite to the surface that is in contact with the first conductive member 41.

With this structure, the connection member 40A functions as a capacitor having the first conductive member 41, the second conductive member 421, and the second conductive member 422 as counter electrodes. By appropriately setting the shapes of the first conductive member 41, the second conductive member 421, the second conductive member 422, the dielectric block 431, and the dielectric block 432, a predetermined capacitance can be realized for a millimeter wave band.

The connection member 40A is disposed inside the insulating substrate 100. In this case, the direction in which the second conductive member 421, the dielectric block 431, the first conductive member 41, the dielectric block 432, and the second conductive member 422 are arranged in order is parallel to the Y direction.

To be more specific, the first conductive member 41 of the connection member 40A is disposed between the signal conductor pattern 21 and the signal conductor pattern 31, and the second conductive member 421 and the second conductive member 422 are disposed between the ground conductor pattern 22 and the ground conductor pattern 32.

A via conductor 51, a via conductor 521, a via conductor 522, a via conductor 61, a via conductor 621, and a via conductor 622 are formed inside the insulating substrate 100. The via conductor 51 connects one surface of the first conductive member 41 to the signal conductor pattern 21 with the shortest distance. The via conductor 61 connects the other surface of the first conductive member 41 (surface opposite to the one surface of the first conductive member 41) to the signal conductor pattern 31 with the shortest distance. The via conductor 521 connects one surface of the second conductive member 421 to the ground conductor pattern 22 with the shortest distance. The via conductor 621 connects the other surface of the second conductive member 421 to the ground conductor pattern 32 with the shortest distance. The via conductor 522 connects one surface of the second conductive member 422 to the ground conductor pattern 22 with the shortest distance. The via conductor 622 connects the other surface of the second conductive member 422 to the ground conductor pattern 32 with the shortest distance.

Also, with such a configuration, the millimeter wave module 10A can obtain operational advantages similar to those of the millimeter wave module 10. Moreover, in the millimeter wave module 10A, the signal conductor pattern 21 and the signal conductor pattern 31 overlap only at one ends and do not overlap at the other parts. Accordingly, unnecessary coupling between the first transmission line 20 and the second transmission line 30 can be suppressed.

Figure 7:
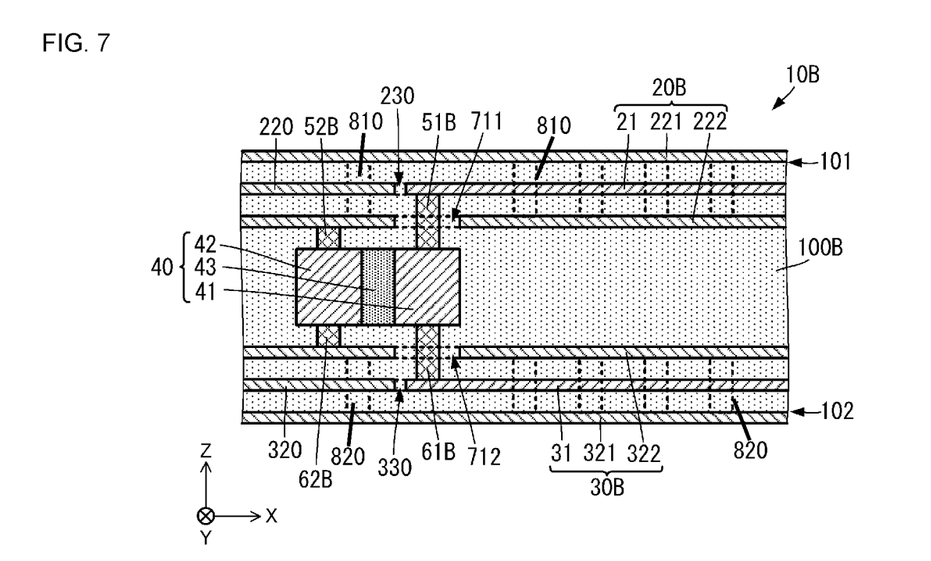
FIG. 7 is a sectional view illustrating the configuration of a millimeter wave module 10B according to a third embodiment.
Figure 8:
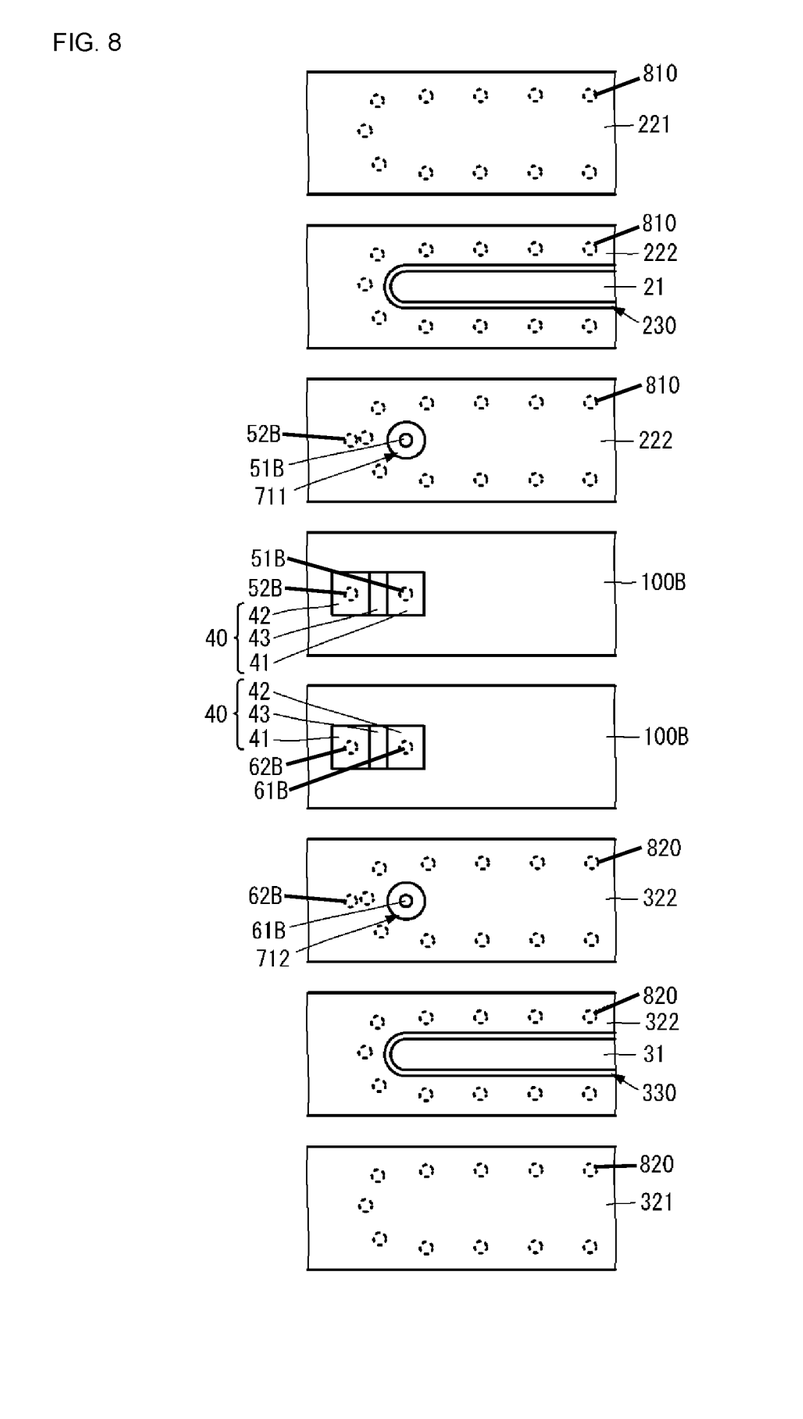
FIG. 8 is an exploded plan view illustrating the configuration of the millimeter wave module 10B according to the third embodiment.

Next, a millimeter wave module according to a third embodiment of the present disclosure will be described with reference to the drawings. FIG. 7 is a sectional view illustrating the configuration of a millimeter wave module 10B according to the third embodiment. FIG. 8 is an exploded plan view illustrating each layer of the configuration of the millimeter wave module 10B viewed in a direction perpendicular to the first main surface 101 of the millimeter wave module 10B according to the third embodiment. To facilitate understanding of configurations, the dimensions in the figures are exaggerated and differ from the actual dimensions.

The millimeter wave module 10B according to the third embodiment differs from the millimeter wave module 10 according to the first embodiment in that a first transmission line 20B and a second transmission line 30B are each formed of a stripline. In other respects, the millimeter wave module 10B is similar to the millimeter wave module 10, and description of similar parts will be omitted.

The first transmission line 20B is formed on the first main surface 101 side of an insulating substrate 100B.

The first transmission line 20B includes a signal conductor pattern 21, a ground conductor pattern 220, a ground conductor pattern 221, and a ground conductor pattern 222.

The signal conductor pattern 21 and the ground conductor pattern 220 are formed on the same layer of the insulating substrate 100B (at the same position in the thickness direction), and are separated from each other by a gap 230.

The ground conductor pattern 221 is formed in the insulating substrate 100B at a position that is closer than the signal conductor pattern 21 and the ground conductor pattern 220 to the surface layer on the first main surface 101 side. The ground conductor pattern 221 overlaps the signal conductor pattern 21 and the ground conductor pattern 220 in plan view.

The ground conductor pattern 222 is formed in the insulating substrate 100B at a position that is closer than the signal conductor pattern 21 and the ground conductor pattern 220 to the center (the connection member 40). The ground conductor pattern 222 overlaps the signal conductor pattern 21 and the ground conductor pattern 220, excluding one end of the signal conductor pattern 21, in plan view.

The ground conductor pattern 222 is connected to the ground conductor pattern 220 and the ground conductor pattern 221 by a plurality of via conductors 810.

With this configuration, the first transmission line 20B forms a stripline.

The ground conductor pattern 222 includes a conductor-free portion 711 at a part thereof that overlaps one end of the signal conductor pattern 21.

The second transmission line 30B is formed on the second main surface 102 side of the insulating substrate 100B.

The second transmission line 30B includes a signal conductor pattern 31, a ground conductor pattern 320, a ground conductor pattern 321, and a ground conductor pattern 322.

The signal conductor pattern 31 and the ground conductor pattern 320 are formed on the same layer of the insulating substrate 100B (at the same position in the thickness direction), and are separated from each other by a gap 330.

The ground conductor pattern 321 is formed in the insulating substrate 100B at a position that is closer than the signal conductor pattern 31 and the ground conductor pattern 320 to the surface layer on the second main surface 102 side. The ground conductor pattern 321 overlaps the signal conductor pattern 31 and the ground conductor pattern 320 in plan view.

The ground conductor pattern 322 is formed in the insulating substrate 100B at a position that is closer than the signal conductor pattern 31 and the ground conductor pattern 320 to the center (the connection member 40). The ground conductor pattern 322 overlaps the signal conductor pattern 31 and the ground conductor pattern 320, excluding one end of the signal conductor pattern 31, in plan view.

The ground conductor pattern 322 is connected to the ground conductor pattern 320 and the ground conductor pattern 321 by a plurality of via conductors 820.

With this configuration, the second transmission line 30B forms a stripline.

The ground conductor pattern 322 includes a conductor-free portion 712 at a part thereof that overlaps one end of the signal conductor pattern 31.

A via conductor 51B is formed at a position that overlaps the conductor-free portion 711, and connects the signal conductor pattern 21 to the first conductive member 41 of the connection member 40.

A via conductor 52B connects the ground conductor pattern 222 to the second conductive member 42 of the connection member 40.

A via conductor 61B is formed at a position that overlaps the conductor-free portion 712, and connects the signal conductor pattern 31 to the first conductive member 41 of the connection member 40.

A via conductor 62B connects the ground conductor pattern 322 to the second conductive member 42 of the connection member 40.

With such a configuration, the millimeter wave module 10B can have operational advantages similar to those of the millimeter wave module 10. That is, irrespective the type of the first transmission line and the type of the second transmission line, transmission loss in a connection line that connects a plurality of transmission lines can be suppressed.

Moreover, in the millimeter wave module 10B, the signal conductor pattern 21 and the signal conductor pattern 31 overlap in plan view. However, the ground conductor pattern 222 and the ground conductor pattern 322 are disposed between the signal conductor pattern 21 and the signal conductor pattern 31. Thus, unnecessary coupling between the signal conductor pattern 21 and the signal conductor pattern 31 can be suppressed, and isolation between the first transmission line 20B and the second transmission line 30B is improved.

Figure 9:
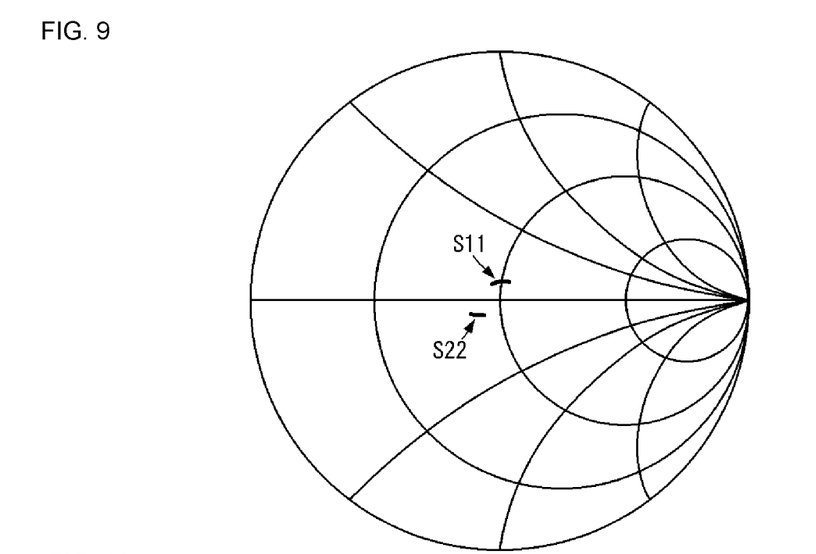
FIG. 9 is a Smith chart illustrating the reflection characteristics of the millimeter wave module 10B according to the third embodiment.

FIG. 9 is a Smith chart illustrating the reflection characteristics of the millimeter wave module 10B according to the third embodiment. FIG. 9 illustrates S11 characteristics and S22 characteristics from 50 GHz to 70 GHz. As illustrated in FIG. 9, by using the configuration of the millimeter wave module 10B, from 50 GHz to 70 GHz, S11 and S12 are near the center of the Smith chart. Accordingly, it can be seen that appropriate impedance matching is performed in a millimeter wave band.

Figure 10:
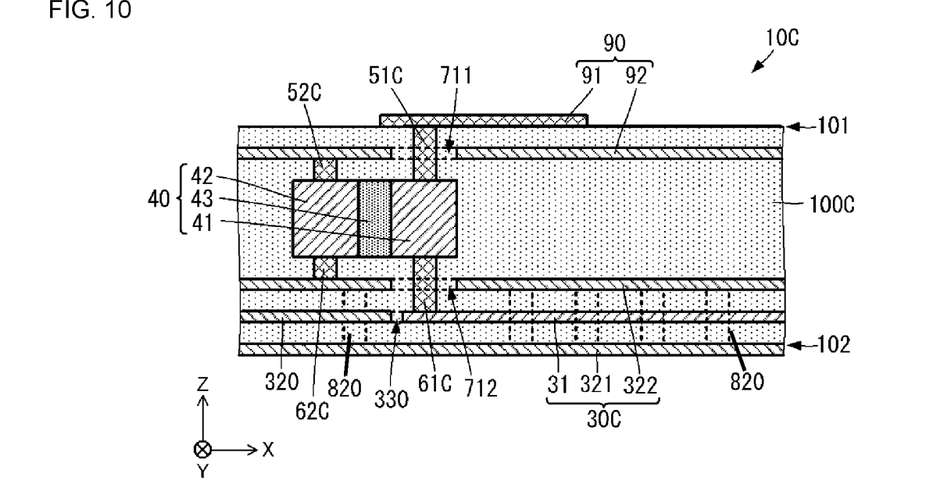
FIG. 10 is a sectional view illustrating the configuration of a millimeter wave module 10C according to a fourth embodiment.

Next, a millimeter wave module according to a fourth embodiment will be described with reference to the drawings. FIG. 10 is a sectional view illustrating the configuration of a millimeter wave module 10C according to the fourth embodiment. To facilitate understanding of configurations, the dimensions in the figure are exaggerated and differ from the actual dimensions.

The millimeter wave module 10C according to the fourth embodiment differs from the millimeter wave module 10B according to the third embodiment in that the first transmission line 20B is changed to an antenna 90. In other respects, the millimeter wave module 10C is similar to the millimeter wave module 10B, and description of similar parts will be omitted.

The antenna 90 is formed on the first main surface 101 side of an insulating substrate 100C. The antenna 90 includes a radiation conductor pattern 91 and a ground conductor pattern 92.

The radiation conductor pattern 91 is formed on the first main surface 101 of the insulating substrate 100C. The radiation conductor pattern 91 is a conductor pattern having a rectangular shape or the like, which forms a so-called patch antenna.

The ground conductor pattern 92 is formed in the insulating substrate 100C at a position that is closer than the radiation conductor pattern 91 to the center (the connection member 40) and at a predetermined distance from the radiation conductor pattern 91. The ground conductor pattern 92 is formed so as to include a region that overlaps the radiation conductor pattern 91 in plan view and to have an area larger than the radiation conductor pattern 91.

The ground conductor pattern 92 includes a conductor-free portion 711 in a portion thereof that overlaps the radiation conductor pattern 91.

A via conductor 51C is formed at a position that overlaps the conductor-free portion 711, and connects the radiation conductor pattern 91 to the first conductive member 41 of the connection member 40. A connection point where the radiation conductor pattern 91 is connected to the via conductor 51C is the feed point of the antenna 90.

A via conductor 52C connects the ground conductor pattern 92 to the second conductive member 42 of the connection member 40.

A second transmission line 30C, a via conductor 61C, and a via conductor 62C are respectively similar to the second transmission line 30B, the via conductor 61B, and the via conductor 62B.

With this configuration, the millimeter wave module 10C realizes a configuration that feeds electricity from the second transmission line 30C to the antenna 90. The millimeter wave module 10C can realize impedance matching between an electricity-feeding transmission line and an antenna with high precision. Accordingly, a millimeter wave antenna module with small loss can be realized.

In the above description, the first conductive member and the second conductive member of the connection member are formed of conductor blocks. However, the first conductive member and the second conductive member may have the following configuration.

Figure 11A:
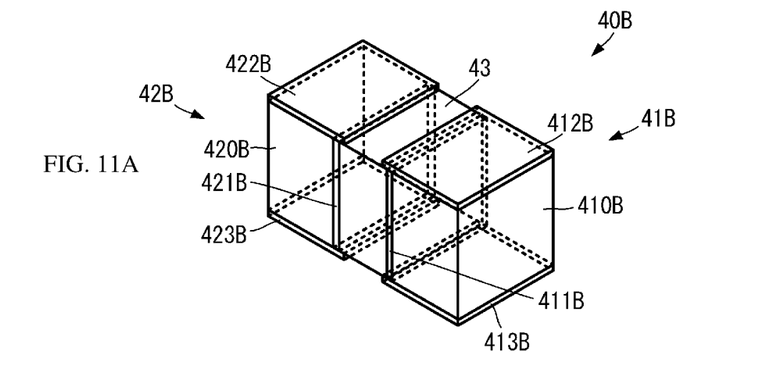
Figure 11B:
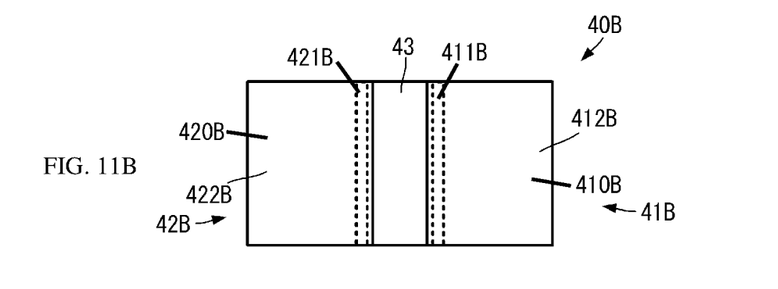
Figure 11C:
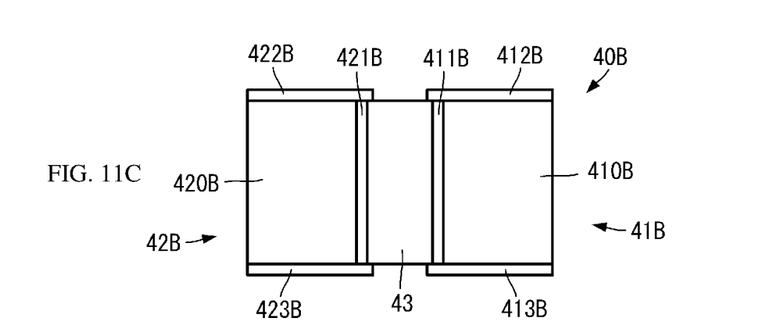
FIG. 11C is a side view of a connection member 40B according to a first modification.

FIG. 11A is a perspective view, FIG. 11B is a plan view, and FIG. 11C is a side view of a connection member 40B according to a first modification.

As illustrated in FIGS. 11A, 11B, and 11C, the connection member 40B includes a first conductive member 41B, a second conductive member 42B, and a dielectric block 43. The first conductive member 41B and the second conductive member 42B sandwich the dielectric block 43 therebetween.

The first conductive member 41B includes a base material portion 410B, a conductor film 411B, a conductor film 412B, and a conductor film 413B. The base material portion 410B is made of a rectangular-parallelepiped-shaped insulator. The base material portion 410B corresponds to "first base material portion" in the present disclosure.

The conductor film 411B is formed on substantially the entirety of a surface of the base material portion 410B that is in contact with the dielectric block 43. The conductor film 411B corresponds to "third conductor film" in the present disclosure. Here, "substantially the entirety of a surface" refers to the entirety of the surface or a surface having an area that is slightly smaller than the area of the surface, which is in contact with the dielectric block 43, and that can realize the function of the conductor film 411B.

The conductor film 412B is formed on a surface of the base material portion 410B that is perpendicular to the surface on which the conductor film 411B is formed. The conductor film 412B covers the entirety of the surface of the base material portion 410B. The conductor film 412B corresponds to "first conductor film" in the present disclosure. In this case, the conductor film 412B extends to a part of a surface of the dielectric block 43. Thus, the conductor film 412B is securely connected to the conductor film 411B.

The conductor film 413B is formed on a surface of the base material portion 410B that is opposite to the surface on which the conductor film 412B is formed. The conductor film 413B covers substantially the entirety of the surface of the base material portion 410B. The conductor film 413B corresponds to "second conductor film" in the present disclosure. In this case, the conductor film 413B extends to a part of a surface of the dielectric block 43. Thus, the conductor film 413B is securely connected to the conductor film 411B.

The second conductive member 42B includes a base material portion 420B, a conductor film 421B, a conductor film 422B, and a conductor film 423B. The base material portion 420B is made of a rectangular-parallelepiped-shaped insulator. The base material portion 420B corresponds to "second base material portion" in the present disclosure.

The conductor film 421B is formed on substantially the entirety of a surface of the base material portion 420B that is in contact with the dielectric block 43. The conductor film 421B corresponds to "sixth conductor film" in the present disclosure.

The conductor film 422B is formed on a surface of the base material portion 420B that is perpendicular to the surface on which the conductor film 421B is formed. The conductor film 422B covers the entirety of the surface of the base material portion 420B. In this case, the conductor film 422B extends to a part of a surface of the dielectric block 43. Thus, the conductor film 422B is securely connected to the conductor film 421B.

The conductor film 423B is formed on a surface of the base material portion 420B that is opposite to the surface on which the conductor film 422B is formed. The conductor film 423B covers substantially the entirety of the surface of the base material portion 420B. In this case, the conductor film 423B extends to a part of a surface of the dielectric block 43. Thus, the conductor film 423B is securely connected to the conductor film 421B. The conductor film 422B and the conductor film 423B correspond to "fifth conductor film" in the present disclosure.

With such a configuration, the connection member 40B generates capacitance due to a structure in which the conductor film 411B and the conductor film 421B sandwich the dielectric block 43 therebetween.

When the connection member 40B having such a configuration is used in the millimeter wave module 10, the conductor film 412B is connected to the via conductor 51, and the conductor film 413B is connected to the via conductor 61. The conductor film 422B is connected to the via conductor 52, and the conductor film 423B is connected to the via conductor 62.

The connection member 40B having such a configuration can also be formed by using a semiconductor forming process or the like so as to have a shape with high precision. Accordingly, operational advantages similar to those of a case where the connection member 40 is used can be obtained.

Figure 12A:
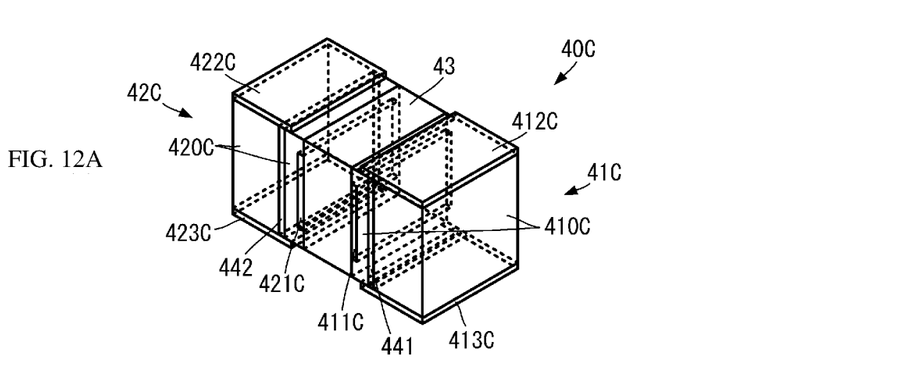
Figure 12B:
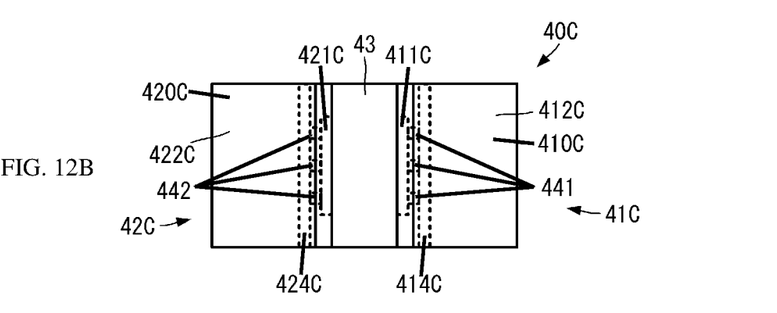
Figure 12C:
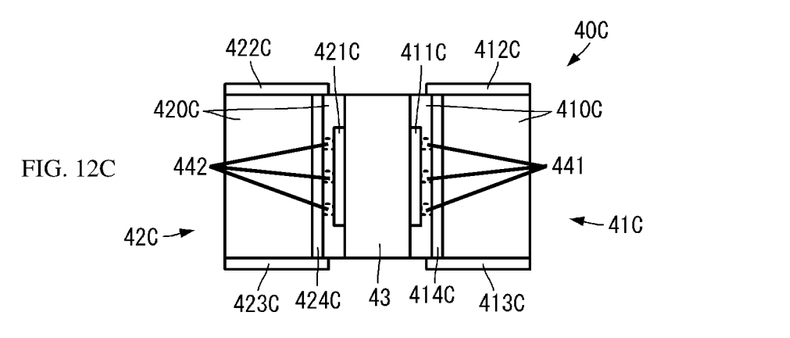
FIG. 12C is a side view of a connection member 40C according to a second modification.

FIG. 12A is a perspective view, FIG. 12B is a plan view, and FIG. 12C is a side view of a connection member 40C according to a second modification.

As illustrated in FIGS. 12A, 12B, and 12C, the connection member 40C includes a first conductive member 41C, a second conductive member 42C, and a dielectric block 43. The first conductive member 41C and the second conductive member 42C sandwich the dielectric block 43 therebetween.

The first conductive member 41C includes a base material portion 410C, a conductor film 411C, a conductor film 412C, a conductor film 413C, a conductor film 414C, and an auxiliary connection conductor 441. The base material portion 410C is made of a rectangular-parallelepiped-shaped insulator. The base material portion 410C corresponds to "first base material portion" in the present disclosure.

The conductor film 411C is formed on a surface of the base material portion 410C that is in contact with the dielectric block 43. The conductor film 411C has a shape that does not reach an outer periphery of the surface of the base material portion 410C that is in contact with the dielectric block 43. The conductor film 411C corresponds to "third conductor film" in the present disclosure.

The conductor film 412C is formed on a surface of the base material portion 410C that is perpendicular to the surface on which the conductor film 411C is formed. The conductor film 412C partially covers the surface of the base material portion 410C. The conductor film 412C corresponds to "first conductor film" in the present disclosure. In this case, the conductor film 412C is formed so as not to protrude to a surface of the dielectric block 43.

The conductor film 413C is formed on a surface of the base material portion 410C that is opposite to the surface on which the conductor film 412C is formed. The conductor film 413C partially covers the surface of the base material portion 410C. The conductor film 413C corresponds to "second conductor film" in the present disclosure. In this case, the conductor film 413C is formed so as not to protrude to a surface of the dielectric block 43.

The conductor film 414C is formed in the base material portion 410C at a position that is at a predetermined distance from the surface on which the conductor film 411C is formed. The conductor film 414C has a surface parallel to the conductor film 411C and has a shape that is exposed to the surface on which the conductor film 412C is formed and the surface on which the conductor film 413C is formed. The conductor film 414C corresponds to "fourth conductor film" in the present disclosure.

The conductor film 414C is connected to the conductor film 412C and is connected to the conductor film 413C.

The auxiliary connection conductor 441 is formed inside the base material portion 410C, and connects the conductor film 414C to the conductor film 411C. The auxiliary connection conductor 441 corresponds to "first auxiliary connection conductor" in the present disclosure.

The second conductive member 42C includes a base material portion 420C, a conductor film 421C, a conductor film 422C, a conductor film 423C, a conductor film 424C, and an auxiliary connection conductor 442. The base material portion 420C is made of a rectangular-parallelepiped-shaped insulator. The base material portion 420C corresponds to "second base material portion" in the present disclosure.

The conductor film 421C is formed on a surface of the base material portion 420C that is in contact with the dielectric block 43. The conductor film 421C has a shape that does not reach an outer periphery of the surface of the base material portion 420C that is in contact with the dielectric block 43. The conductor film 421C corresponds to "sixth conductor film" in the present disclosure.

The conductor film 422C is formed on a surface of the base material portion 420C that is perpendicular to the surface on which the conductor film 421C is formed. The conductor film 422C partially covers the surface of the base material portion 420C. In this case, the conductor film 422C is formed so as not to protrude to a surface of the dielectric block 43.

The conductor film 423C is formed on a surface of the base material portion 420C that is opposite to the surface on which the conductor film 422C is formed. The conductor film 423C partially covers the surface of the base material portion 420C. In this case, the conductor film 423C is formed so as not to protrude to a surface of the dielectric block 43. The conductor film 422C and the conductor film 423C correspond to "fifth conductor film" in the present disclosure.

The conductor film 424C is formed in the base material portion 420C at a position that is at a predetermined distance from the surface on which the conductor film 421C is formed. The conductor film 424C has a surface parallel to the conductor film 421C and has a shape that is exposed to the surface on which the conductor film 422C is formed and the surface on which the conductor film 423C is formed. The conductor film 424C corresponds to "seventh conductor film" in the present disclosure.

The conductor film 424C is connected to the conductor film 422C and is connected to the conductor film 423C.

The auxiliary connection conductor 442 is formed inside the base material portion 420C, and connects the conductor film 424C to the conductor film 421C. The auxiliary connection conductor 442 corresponds to "second auxiliary connection conductor" in the present disclosure.

With such a configuration, the connection member 40C generates capacitance due to a structure in which the conductor film 411C and the conductor film 421C sandwich the dielectric block 43 therebetween.

When the connection member 40C having such a configuration is used in the millimeter wave module 10, the conductor film 412C is connected to the via conductor 51, and the conductor film 413C is connected to the via conductor 61. The conductor film 422C is connected to the via conductor 52, and the conductor film 423C is connected to the via conductor 62.

The connection member 40C having such a configuration can also be formed by using a semiconductor forming process or the like so as to have a shape with high precision.

Accordingly, operational advantages similar to those of a case where the connection member 40 is used can be obtained.

By using the configuration of the connection member 40C, the distance between the conductor film 412C and the conductor film 422C and the distance between the conductor film 413C and the conductor film 423C can be increased. Thus, unnecessary coupling between these conductive films can be suppressed.

Configurations of the embodiments described above can be combined in any appropriate manner, and operational advantages in accordance with the combinations can be obtained.

REFERENCE SIGNS LIST 10, 10A, 10B, 10C millimeter wave module
20, 20B first transmission line
21, 31 signal conductor pattern
22, 32, 92, 220, 221, 222, 320, 321, 322 ground conductor pattern
23, 33, 230, 330 gap
30, 30B, 30C second transmission line
40, 40A, 40B, 40C connection member
41, 41B, 41C first conductive member
42, 42B, 42C second conductive member dielectric block
51, 51B, 51C, 52, 52B, 52C, 61, 61B, 61C, 62, 62B, 62C, 521, 522, 621, 622, 810, 820 via conductor
90 antenna
91 radiation conductor pattern
100, 100B, 100C insulating substrate
101 first main surface
102 second main surface
410B, 410C, 420B, 420C base material portion
411B, 411C, 412B, 412C, 413B, 413C, 414C, 421B, 421C,
422B, 422B, 422C, 423B, 423C, 424C conductor film
421, 422 second conductive member
431, 432 dielectric block
441, 442 auxiliary connection conductor
711, 712 conductor-free portion

The invention claimed is:

1. A millimeter wave module comprising:
an insulating substrate having a first main surface and a second main surface that are disposed at different positions in a thickness direction and that are parallel to each other;
a first conductor pattern on the first main surface, wherein the first conductor pattern transmits a millimeter wave signal;
a second conductor pattern on the second main surface, wherein the second conductor pattern transmits the millimeter wave signal;
a ground conductor pattern on the first main surface or the second main surface; and
a connection member between the first conductor pattern and the second conductor pattern in the thickness direction, the connection member electrically connects the first conductor pattern to the second conductor pattern,
wherein the connection member includes a first conductive member, a second conductive member, and a dielectric block, and has a block shape in which the first conductive member and the second conductive member sandwich the dielectric block therebetween,
wherein the first conductive member is connected to the first conductor pattern and the second conductor pattern, and
wherein the second conductive member is connected to the ground conductor pattern.

2. The millimeter wave module according to claim 1, wherein the first conductive member and the second conductive member are conductor blocks.

3. The millimeter wave module according to claim 2, wherein a dielectric constant of the dielectric block differs from a dielectric constant of the insulating substrate.

4. The millimeter wave module according to claim 1, wherein the first conductive member includes
a rectangular-parallelepiped-shaped first base material portion that is rectangular and that has insulating ability,
a first conductor film on a surface of the first base material portion, the surface facing the first conductor pattern,
a second conductor film on a surface of the first base material portion, the surface facing the second conductor pattern, and
a third conductor film configured to form a capacitance, the third conductor film being connected to the first conductor film and the second conductor film, and the third conductor film being on a surface of the first base material portion, the surface being in contact with the dielectric block.

5. The millimeter wave module according to claim 3, wherein the first conductive member includes
a fourth conductor film disposed at a position that is distanced further than the third conductor film from the dielectric block, and
a first auxiliary connection conductor that connects the third conductor film to the fourth conductor film,
wherein the third conductor film does not reach a surface of the first conductive member on which the first conductor film is disposed and a surface of the first conductive member on which the second conductor film is disposed, and
wherein the first conductor film and the second conductor film do not reach a surface of the first conductive member on which the third conductor film is disposed and the first conductor film and the second conductor film are connected to the fourth conductor film.

6. The millimeter wave module according to claim 5, wherein the second conductive member includes
a rectangular-parallelepiped-shaped second base material portion that has insulating ability,
a fifth conductor film on a surface of the second base material portion, the surface facing the ground conductor pattern, and
a sixth conductor film configured to form a capacitance, the sixth conductor film being on a surface of the second base material portion, the surface being in contact with the dielectric block.

7. The millimeter wave module according to claim 5, wherein a dielectric constant of the dielectric block differs from a dielectric constant of the insulating substrate.

8. The millimeter wave module according to claim 3, wherein the second conductive member includes
a rectangular-parallelepiped-shaped second base material portion that has insulating ability,
a fifth conductor film on a surface of the second base material portion, the surface facing the ground conductor pattern, and a sixth conductor film configured to form a capacitance, the sixth conductor film being on a surface of the second base material portion, the surface being in contact with the dielectric block.

9. The millimeter wave module according to claim 3, wherein a dielectric constant of the dielectric block differs from a dielectric constant of the insulating substrate.

10. The millimeter wave module according to claim 1, wherein the second conductive member includes
    a rectangular-parallelepiped-shaped second base material portion that has insulating ability,
    a fifth conductor film on a surface of the second base material portion, the surface facing the ground conductor pattern, and
    a sixth conductor film configured to form a capacitance, the sixth conductor film being on a surface of the second base material portion, the surface being in contact with the dielectric block.

11. The millimeter wave module according to claim 10, wherein the second conductive member includes
    a seventh conductor film at a position that is distanced further than the sixth conductor film from the dielectric block, and
    a second auxiliary connection conductor that connects the sixth conductor film to the seventh conductor film,
    wherein the sixth conductor film does not reach a surface of the second conductive member on which the ground conductor pattern is disposed, and
    wherein the ground conductor pattern does not reach a surface of the second conductive member on which the sixth conductor film is disposed and is connected to the seventh conductor film.

12. The millimeter wave module according to claim 11, wherein a dielectric constant of the dielectric block differs from a dielectric constant of the insulating substrate.

13. The millimeter wave module according to claim 10, wherein a dielectric constant of the dielectric block differs from a dielectric constant of the insulating substrate.

14. The millimeter wave module according to claim 1, wherein a dielectric constant of the dielectric block differs from a dielectric constant of the insulating substrate.

15. The millimeter wave module according to claim 14, wherein the dielectric constant of the dielectric block is higher than the dielectric constant of the insulating substrate.

\* \* \* \* \*